US009973851B2

(12) United States Patent
Chamness et al.

(10) Patent No.: US 9,973,851 B2
(45) Date of Patent: May 15, 2018

(54) MULTI-CHANNEL PLAYBACK OF AUDIO CONTENT

(71) Applicant: Sonos, Inc., Santa Barbara, CA (US)

(72) Inventors: Mike Chamness, Gloucester, MA (US); Aurelio Rafael Ramos, Jamaica Plain, MA (US); Timothy Sheen, Brighton, MA (US); Hilmar Lehnert, Framingham, MA (US)

(73) Assignee: Sonos, Inc., Santa Barbara, CA (US)

( * ) Notice: Subject to any disclaimer, the term of this patent is extended or adjusted under 35 U.S.C. 154(b) by 15 days.

(21) Appl. No.: 14/557,019

(22) Filed: Dec. 1, 2014

(65) Prior Publication Data

US 2016/0157016 A1 Jun. 2, 2016

(51) Int. Cl.
*H03G 5/00* (2006.01)
*H04R 3/04* (2006.01)
(Continued)

(52) U.S. Cl.
CPC ............... *H04R 3/04* (2013.01); *H04S 1/002* (2013.01); *H04R 1/403* (2013.01); (Continued)

(58) Field of Classification Search
USPC .................. 381/97, 98, 300, 303, 307, 1, 17
See application file for complete search history.

(56) References Cited

U.S. PATENT DOCUMENTS 4,306,113 A 12/1981 Morton
4,592,088 A 5/1986 Shimada
(Continued)

FOREIGN PATENT DOCUMENTS

EP 1126743 8/2001
EP 1126744 8/2001
(Continued)

OTHER PUBLICATIONS

""Constellation Acoustic System: a revolutionary breakthrough in acoustical design" Meyer Sound Laboratories, Inc., <http://www.meyersound.com/pdf/brochures/constellation_brochure_c.pdf> 2012, 32 pages".
(Continued)

*Primary Examiner* — Joseph Saunders, Jr.
*Assistant Examiner* — James Mooney
(74) *Attorney, Agent, or Firm* — McDonnell Boehnen Hulbert & Berghoff LLP

(57) ABSTRACT

An example method is performed by a media playback system comprising a plurality of audio drivers having a first radiation pattern. The method includes receiving data representing audio content, where each datum of the data indicates (i) a frequency and (ii) an amplitude corresponding to the frequency. The method further includes, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern. An example media playback system and an example non-transitory computer-readable medium related to the example method is also disclosed herein.

15 Claims, 8 Drawing Sheets

(51) Int. Cl.
*H04S 1/00* (2006.01)
*H04R 1/40* (2006.01)
*H04S 3/00* (2006.01)

(52) U.S. Cl.
CPC .... *H04R 2201/403* (2013.01); *H04R 2203/12* (2013.01); *H04R 2205/024* (2013.01); *H04R 2227/005* (2013.01); *H04S 3/002* (2013.01)

(56) References Cited

U.S. PATENT DOCUMENTS 4,700,389 A 10/1987 Nakayama
4,995,778 A 2/1991 Brussel
5,146,507 A 9/1992 Satoh
5,440,644 A 8/1995 Farinelli et al.
5,632,005 A 5/1997 Davis
5,761,320 A 6/1998 Farinelli et al.
5,870,484 A * 2/1999 Greenberger ............ H04R 5/02 381/17
5,910,991 A 6/1999 Farrar
5,923,902 A 7/1999 Inagaki
6,005,947 A 12/1999 Lim
6,021,386 A 2/2000 Davis
6,032,202 A 2/2000 Lea et al.
6,256,554 B1 7/2001 DiLorenzo
6,404,811 B1 6/2002 Cvetko et al.
6,469,633 B1 10/2002 Wachter
6,522,886 B1 2/2003 Youngs et al.
6,587,565 B1 7/2003 Choi
6,611,537 B1 8/2003 Edens et al.
6,631,410 B1 10/2003 Kowalski et al.
6,721,428 B1 4/2004 Allred et al.
6,757,517 B2 6/2004 Chang
6,766,025 B1 7/2004 Levy et al.
6,778,869 B2 8/2004 Champion
6,928,172 B2 8/2005 Ohta
7,058,186 B2 6/2006 Tanaka
7,058,187 B2 6/2006 Ohta
7,068,799 B2 6/2006 Ohta
7,072,477 B1 7/2006 Kincaid
7,103,187 B1 9/2006 Neuman
7,130,608 B2 10/2006 Hollstrom et al.
7,130,616 B2 10/2006 Janik
7,143,939 B2 12/2006 Henzerling
7,171,009 B2 1/2007 Ohta
7,236,773 B2 6/2007 Thomas
7,295,548 B2 11/2007 Blank et al.
7,483,538 B2 1/2009 McCarty et al.
7,489,784 B2 2/2009 Yoshino
7,490,044 B2 2/2009 Kulkarni
7,492,909 B2 2/2009 Carter et al.
7,519,188 B2 4/2009 Berardi et al.
7,529,377 B2 5/2009 Nackvi et al.
7,571,014 B1 8/2009 Lambourne et al.
7,630,500 B1 12/2009 Beckman et al.
7,630,501 B2 12/2009 Blank et al.
7,643,894 B2 1/2010 Braithwaite et al.
7,657,910 B1 2/2010 McAulay et al.
7,676,044 B2 3/2010 Sasaki et al.
7,853,341 B2 12/2010 McCarty et al.
7,949,140 B2 5/2011 Kino
7,961,893 B2 6/2011 Kino
7,987,294 B2 7/2011 Bryce et al.
8,014,423 B2 9/2011 Thaler et al.
8,045,952 B2 10/2011 Qureshey et al.
8,063,698 B2 11/2011 Howard
8,103,009 B2 1/2012 McCarty et al.
8,139,774 B2 3/2012 Berardi et al.
8,160,281 B2 4/2012 Kim et al.
8,175,292 B2 5/2012 Aylward et al.
8,229,125 B2 7/2012 Short
8,233,632 B1 7/2012 MacDonald et al.
8,234,395 B2 7/2012 Millington et al.
8,238,578 B2 8/2012 Aylward
8,243,961 B1 8/2012 Morrill
8,265,310 B2 9/2012 Berardi et al.
8,270,620 B2 9/2012 Christensen
8,290,185 B2 10/2012 Kim
8,306,235 B2 11/2012 Mahowald
8,325,935 B2 12/2012 Rutschman
8,331,585 B2 12/2012 Hagen et al.
8,391,501 B2 3/2013 Khawand et al.
8,401,202 B2 3/2013 Brooking
8,452,020 B2 5/2013 Gregg et al.
8,483,853 B1 7/2013 Lambourne
8,577,045 B2 11/2013 Gibbs
8,577,048 B2 11/2013 Chaikin et al.
8,600,075 B2 12/2013 Lim
8,620,006 B2 12/2013 Berardi et al.
8,761,419 B2 * 6/2014 Devantier ............... H04S 7/301 381/17
8,855,319 B2 10/2014 Liu et al.
8,879,761 B2 11/2014 Johnson et al.
8,903,526 B2 12/2014 Beckhardt
8,914,559 B2 12/2014 Kalayjian et al.
8,934,647 B2 1/2015 Joyce et al.
8,934,655 B2 1/2015 Breen et al.
8,965,546 B2 2/2015 Visser et al.
8,977,974 B2 3/2015 Kraut
8,984,442 B2 3/2015 Pirnack et al.
9,020,153 B2 4/2015 Britt, Jr.
2001/0042107 A1 11/2001 Palm
2002/0022453 A1 2/2002 Balog et al.
2002/0026442 A1 2/2002 Lipscomb et al.
2002/0124097 A1 9/2002 Isely et al.
2003/0157951 A1 8/2003 Hasty
2004/0024478 A1 2/2004 Hans et al.
2005/0271213 A1 12/2005 Kim
2007/0142944 A1 6/2007 Goldberg et al.
2008/0165976 A1 7/2008 Albert
2008/0181416 A1 * 7/2008 Jung ...................... H04R 1/403 381/2
2010/0119091 A1 5/2010 Fukuhara et al.
2010/0142735 A1 6/2010 Yoon et al.
2010/0323793 A1 * 12/2010 Andall .................... A63F 13/54 463/35
2011/0170710 A1 7/2011 Son
2012/0051558 A1 3/2012 Kim et al.
2012/0127831 A1 5/2012 Gicklhorn et al.
2012/0148075 A1 * 6/2012 Goh ........................ H04S 7/301 381/303
2012/0263318 A1 * 10/2012 Millington ............. G11B 27/10 381/107
2012/0263325 A1 10/2012 Freeman et al.
2013/0010970 A1 1/2013 Hegarty et al.
2013/0022221 A1 * 1/2013 Kallai ...................... H04R 3/12 381/300
2013/0028443 A1 1/2013 Pance et al.
2013/0259254 A1 10/2013 Xiang et al.
2014/0016784 A1 1/2014 Sen et al.
2014/0016786 A1 1/2014 Sen
2014/0016802 A1 1/2014 Sen
2014/0023196 A1 1/2014 Xiang et al.
2014/0112481 A1 4/2014 Li et al.
2014/0219456 A1 8/2014 Morrell et al.
2014/0226823 A1 8/2014 Sen et al.
2014/0294200 A1 10/2014 Baumgarte et al.
2014/0355768 A1 12/2014 Sen et al.
2014/0355794 A1 12/2014 Morrell et al.
2015/0063610 A1 3/2015 Mossner
2015/0146886 A1 5/2015 Baumgarte
2015/0201274 A1 7/2015 Ellner et al.
2015/0281866 A1 10/2015 Williams et al.

FOREIGN PATENT DOCUMENTS

EP 1126745 8/2001
EP 1133896 B1 8/2002
EP 1389853 A1 2/2004
EP 1825713 B1 10/2012
EP 2860992 A1 4/2015

(56) References Cited

FOREIGN PATENT DOCUMENTS

| | | | |
|---|---|---|---|
| WO | 200153994 | | 7/2001 |
| WO | 2003093950 | A2 | 11/2003 |
| WO | 2015024881 | A1 | 2/2015 |

OTHER PUBLICATIONS

"“Constellation Microphones,” Meyer Sound Laboratories, Inc., <http://www.meyersound.com/sites/default/files/constellation_microphones.pdf> 2013, 2 pages”.

“Ross, Alex. “Wizards of Sound: Retouching acoustics, from the restaurant to the concert hall” The New Yorker, Feb. 23, 2015. Web. Feb. 26, 2015”.

“AudioTron Quick Start Guide, Version 1.0”, Voyetra Turtle Beach, Inc., Mar. 2001, 24 pages.

“AudioTron Reference Manual, Version 3.0”, Voyetra Turtle Beach, Inc., May 2002, 70 pages.

“AudioTron Setup Guide, Version 3.0”, Voyetra Turtle Beach, Inc., May 2002, 38 pages.

Bluetooth. “Specification of the Bluetooth System: The ad hoc SCATTERNET for affordable and highly functional wireless connectivity,” Core, Version 1.0 A, Jul. 26, 1999, 1068 pages.

Bluetooth. “Specification of the Bluetooth System: Wireless connections made easy,” Core, Version 1.0 B, Dec. 1, 1999, 1076 pages.

Dell, Inc. “Dell Digital Audio Receiver: Reference Guide,” Jun. 2000, 70 pages.

Dell, Inc. “Start Here,” Jun. 2000, 2 pages.

Jo et al., “Synchronized One-to-many Media Streaming with Adaptive Playout Control,” Proceedings of SPIE, 2002, pp. 71-82, vol. 4861.

Jones, Stephen, “Dell Digital Audio Receiver: Digital upgrade for your analog stereo” Analog Stereo Jun. 24, 2000 retrieved Jun. 18, 2014, 2 pages.

Louderback, Jim, “Affordable Audio Receiver Furnishes Homes With MP3” TechTV Vault. Jun. 28, 2000 retrieved Jul. 10, 2014, 2 pages.

Palm, Inc., “Handbook for the Palm VII Handheld,” May 2000, 311 pages.

Presentations at WinHEC 2000, May 2000, 138 pages.

UPnP; “Universal Plug and Play Device Architecture,” Jun. 8, 2000; version 1.0; Microsoft Corporation; pp. 1-54.

International Searching Authority, International Search Report and Written Opinion dated Feb. 19, 2016, issued in connection with International Application Application No. PCT/US2015/063008, filed on Nov. 30, 2015, 11 pages.

U.S. Appl. No. 14/216,306.

U.S. Appl. No. 14/216,325.

U.S. Appl. No. 14/481,514.

“Denon 2003-2004 Product Catalog,” Denon, 2003-2004, 44 pages.

United States Patent and Trademark Office, U.S. Appl. No. 60/490,768, filed Jul. 28, 2003, entitled “Method for synchronizing audio playback between multiple networked devices,” 13 pages.

United States Patent and Trademark Office, U.S. Appl. No. 60/825,407, filed Sep. 12, 2003, entitled “Controlling and manipulating groupings in a multi-zone music or media system,” 82 pages.

Yamaha DME 64 Owner's Manual; copyright 2004, 80 pages.

Yamaha DME Designer 3.5 setup manual guide; copyright 2004, 16 pages.

Yamaha DME Designer 3.5 User Manual; Copyright 2004, 507 pages.

* cited by examiner

MULTI-CHANNEL PLAYBACK OF AUDIO CONTENT

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
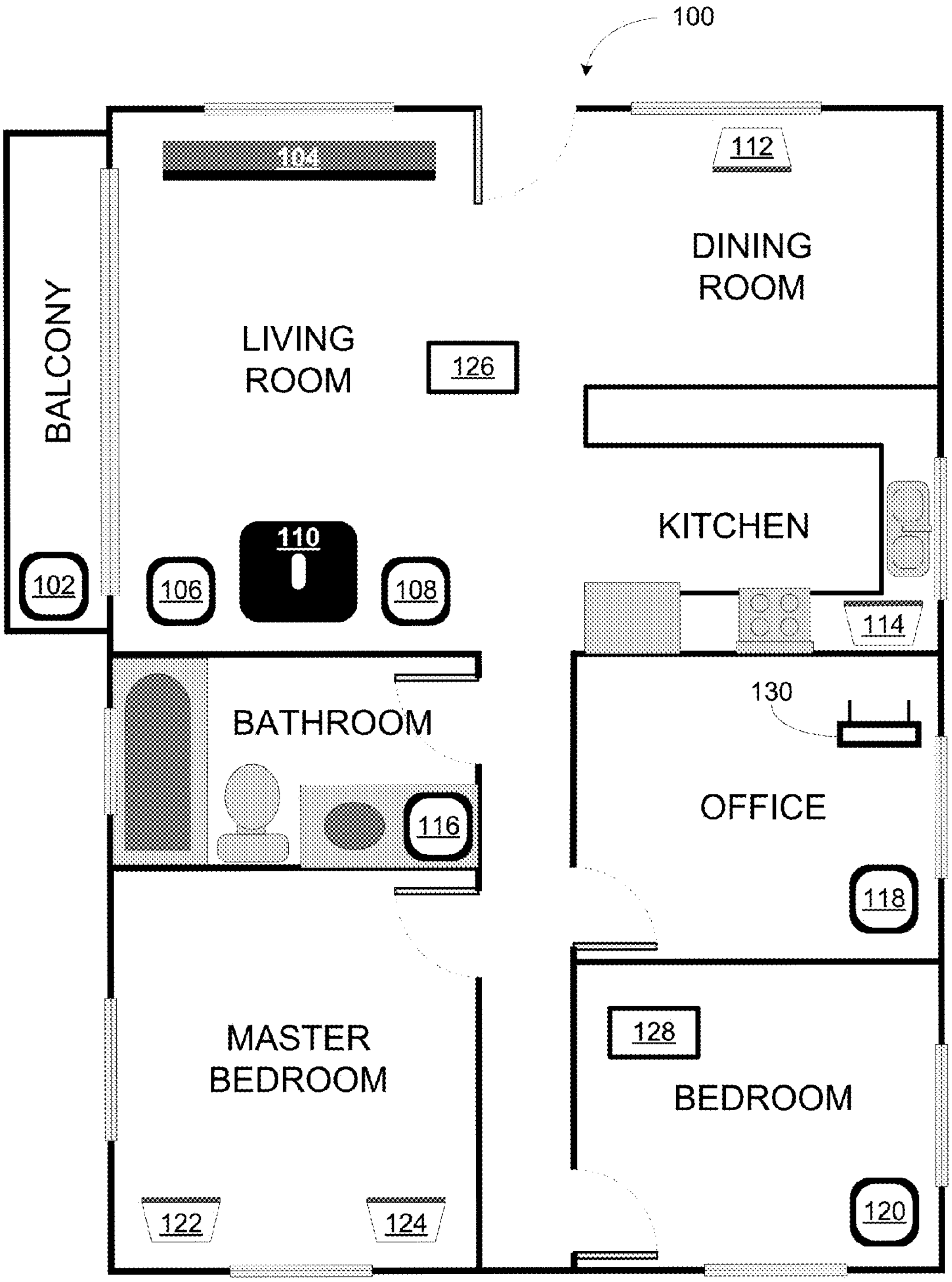
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Multi-channel playback of audio content may enhance a listener's experience by causing the listener to perceive a balanced directional effect when the audio content is played back. In one example, multi-channel playback of the audio content may be facilitated by multiple audio drivers and/or multiple playback devices.

For instance, playing back the audio content in stereo may include (i) providing a first signal representing a "left" channel of the audio content to a first set of one or more audio drivers (e.g., of a first playback device) and (ii) providing a second signal representing a "right" channel of the audio content to a second set of one or more audio drivers (e.g., of a second playback device). In another example, playing back the audio content in a surround sound format may include providing signals representing various channels of the audio content to several respective sets of one or more audio drivers (e.g., sets of audio drivers corresponding respectively to a center playback device, a right playback device, a left playback device, and a subwoofer).

In some cases, however, the balanced directional effect produced by a media playback system performing multi-channel playback might only be perceivable at limited locations within the environment of the media playback system. In the stereo playback example, the listener might only perceive the balanced directional effect if the listener is relatively equidistant from the first set of audio drivers and the second set of audio drivers. However, if the listener is significantly closer to the first set of audio drivers than the second set of audio drivers, the "left" channel may be overly predominant in the listener's perception, and if the listener is much closer to the second set of audio drivers than the first set of audio drivers, the "right" channel may be overly predominant in the listener's perception. But, by manipulating input signals provided to the respective first and second sets of audio drivers, the area over which the listener perceives the balanced directional effect during playback may be increased.

For instance, each audio driver of the first and second sets of audio drivers may have its own radiation pattern. A radiation pattern may define a direction-dependent and/or frequency-dependent amplitude of sound waves provided by the corresponding audio driver at a given radius from the audio driver for a given amplitude of input signal. A radiation pattern corresponding to a given audio driver may be dependent on the given audio driver's construction, structure, geometry, materials, or orientation/position within a speaker box, for example. Such a radiation pattern that is dependent on "natural" features of the audio driver (and not audio processing techniques, for example) may be referred to as an inherent radiation pattern.

For example, the inherent radiation pattern of each audio driver of the first set may contribute, via superposition, to form a first inherent radiation pattern. Likewise, the inherent radiation pattern of each audio driver of the second set may contribute to form a second inherent radiation pattern. At some listening positions, the first inherent radiation pattern may represent greater loudness than the second inherent radiation pattern (causing the listener's perception of the first channel to predominate), and at other listening positions, the second inherent radiation pattern may represent greater loudness than the first inherent radiation pattern (causing the listener's perception of the second channel to predominate).

In order to widen an area over which a balanced directional effect may be perceivable, signal processing may be used to produce first and second target radiation patterns corresponding respectively to the first and second sets of audio drivers. When compared to the pairing of the first and second inherent radiation patterns, a pairing of the first and second target radiation patterns may define a wider listening area, over one or more ranges of frequencies, within which the balanced directional effect of multi-channel playback may be perceived by the listener. For example, at a given frequency, boosting (or attenuating) a magnitude of an input signal provided to a particular audio driver of the first set may help compensate for the particular audio driver being relatively quiet (or relatively loud) along a given listening direction. Adding a phase offset (e.g., a time delay or shift) to an input signal of the particular audio driver may similarly help compensate for (i) the first and second inherent radiation patterns representing different loudnesses at a given listening position and/or (ii) the sound waves generated respectively by the first and second sets of audio drivers arriving at the listener's location at different times.

Accordingly, some examples described herein involve, among other things, a media playback system receiving data representing audio content, processing the data in a frequency-dependent manner for each of a plurality of audio drivers of the media playback system, and providing the audio drivers respective signals representing the data processed for each audio driver. This may result in the plurality of audio drivers playing back the audio content according to target radiation patterns that produce a balanced directional effect over a wide listening area when compared to the inherent radiation patterns of the audio drivers. Other aspects of the examples will be made apparent in the remainder of the description herein.

Examples disclosed herein may generally involve a first computing device of a media playback system processing audio data for itself and/or to be provided to other computing devices of the media playback system, but one of skill in the art will appreciate that the first computing device may also determine processing parameters, and provide the processing parameters to the other computing devices so that the other computing devices may use the processing parameters to process their own audio data according to the methods disclosed herein.

In one aspect, an example media playback system includes a processor, a plurality of audio drivers having a first radiation pattern, and a non-transitory computer-readable medium storing instructions that when executed by the processor cause the media playback system to perform functions. The functions include receiving data representing audio content, where each datum of the data indicates (i) a frequency and (ii) an amplitude corresponding to the frequency. The functions further include, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

In another aspect, an example method is performed by a media playback system comprising a plurality of audio drivers having a first radiation pattern. The method includes receiving data representing audio content, where each datum of the data indicates (i) a frequency and (ii) an amplitude corresponding to the frequency. The method further includes, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

In yet another aspect, an example non-transitory computer-readable medium stores instructions that when executed by a media playback system cause the media playback system to perform functions. The media playback system includes a plurality of audio drivers having a first radiation pattern. The functions include receiving data representing audio content, where each datum of the data indicates (i) a frequency and (ii) an amplitude corresponding to the frequency. The functions further include, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

It will be understood by one of ordinary skill in the art that this disclosure includes numerous other embodiments. While some examples described herein may refer to functions performed by given actors such as "users" and/or other entities, it should be understood that this is for purposes of explanation only. The claims should not be interpreted to require action by any such example actor unless explicitly required by the language of the claims themselves.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102, 104, 106, 108, 110, 112, 114, 116, 118, 120, 122, and 124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
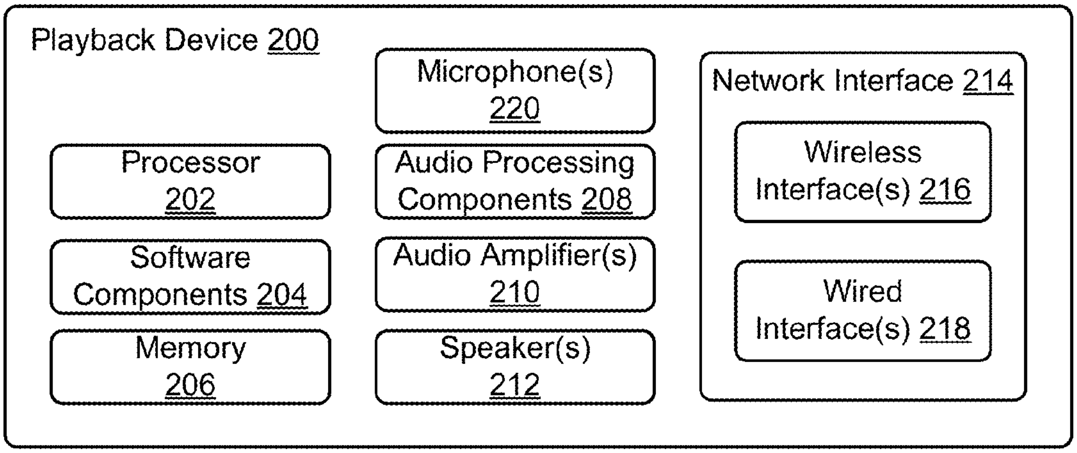
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 might not include the speaker(s)

212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The microphone(s) 220 may include an audio sensor configured to convert detected sounds into electrical signals. The electrical signal may be processed by the audio processing components 208 and/or the processor 202. The microphone(s) 220 may be positioned in one or more orientations at one or more locations on the playback device 200. The microphone(s) 220 may be configured to detect sound within one or more frequency ranges. In one case, one or more of the microphone(s) 220 may be configured to detect sound within a frequency range of audio that the playback device 200 is capable or rendering. In another case, one or more of the microphone(s) 220 may be configured to detect sound within a frequency range audible to humans. Other examples are also possible.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being played by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
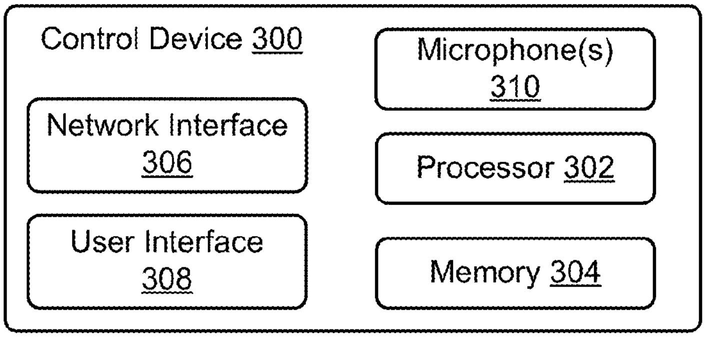
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

The microphone(s) 310 may include an audio sensor configured to convert detected sounds into electrical signals. The electrical signal may be processed by the processor 302. In one case, if the control device 300 is a device that may also be used as a means for voice communication or voice recording, one or more of the microphone(s) 310 may be a microphone for facilitating those functions. For instance, the one or more of the microphone(s) 310 may be configured to detect sound within a frequency range that a human is capable of producing and/or a frequency range audible to humans. Other examples are also possible.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
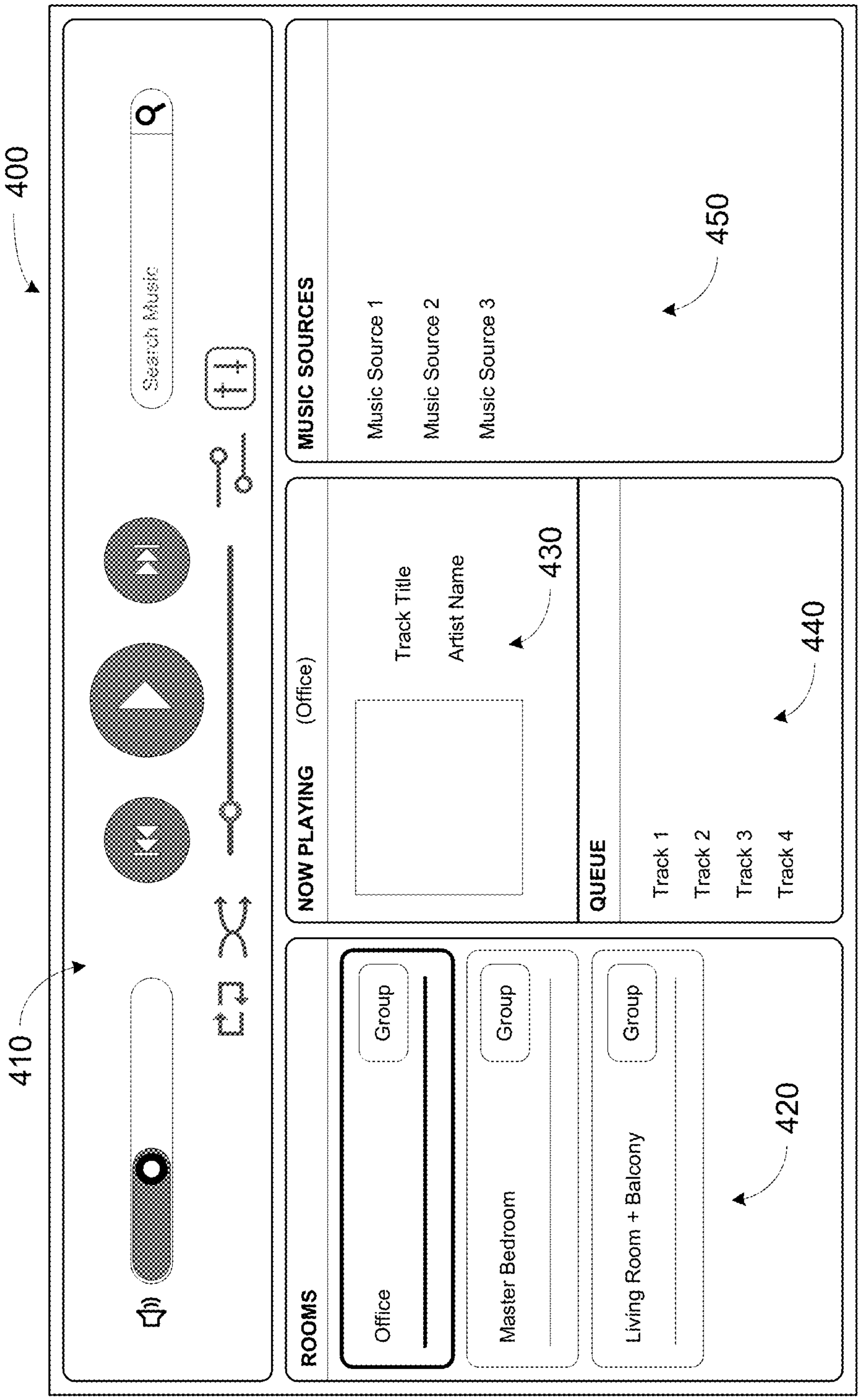
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Methods Related to Multi-Channel Playback of Audio Content

As discussed above, some examples described herein involve, among other things, a media playback system receiving data representing audio content, processing the data in a frequency-dependent manner for each of a plurality of audio drivers of the media playback system, and providing the audio drivers respective signals representing the data processed for each audio driver. This may result in the plurality of audio drivers playing back the audio content according to target radiation patterns that produce a balanced directional effect over a wide listening area when compared to the inherent radiation patterns of the audio drivers.

Figure 5:
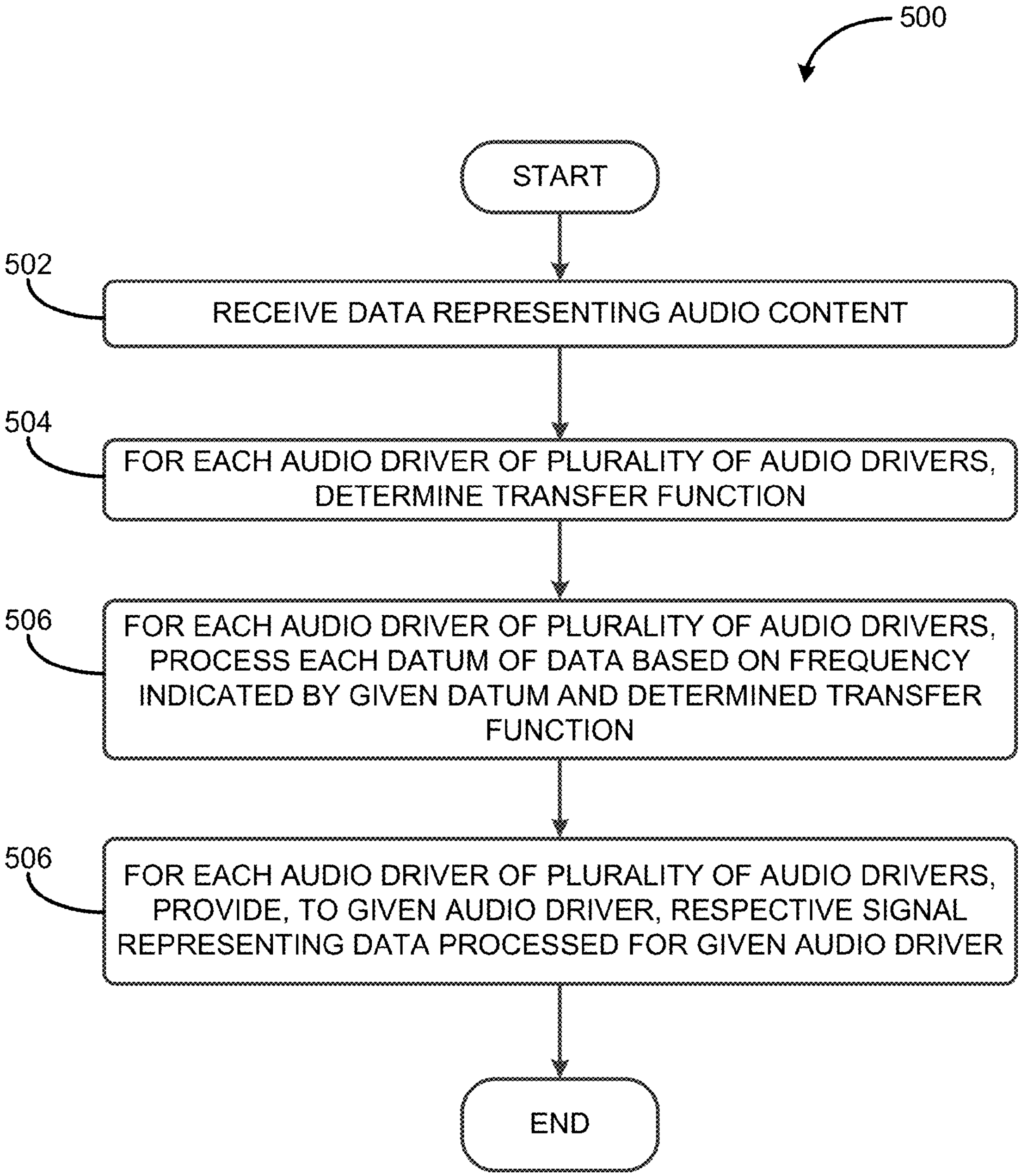
FIG. 5 shows a flow diagram for an example method.

Method 500 shown in FIG. 5 presents an example method that can be implemented within an operating environment involving, for example, the media playback system 100 of FIG. 1, one or more of the playback device 200 of FIG. 2, and one or more of the control device 300 of FIG. 3. Method 500 may include one or more operations, functions, or actions as illustrated by one or more of blocks 502, 504, 506, and 508. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 500 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer-readable medium, for example, such as a storage device including a disk or hard drive. The computer-readable medium may include non-transitory computer-readable medium, for example, such as computer-readable media that stores data for short periods of time like register memory, processor cache and Random Access Memory (RAM). The computer-readable medium may also include non-transitory media, such as secondary or persistent long term storage, like read only memory (ROM), optical or magnetic disks, compact-disc read only memory (CD-ROM), for example. The computer-readable media may also be any other volatile or non-volatile storage systems. The computer-readable medium may be considered a computer-readable storage medium, for example, or a tangible storage device. In addition, for the method 500 and other processes and methods disclosed herein, each block in FIG. 5 may represent circuitry that is wired to perform the specific logical functions in the process.

Figure 6:
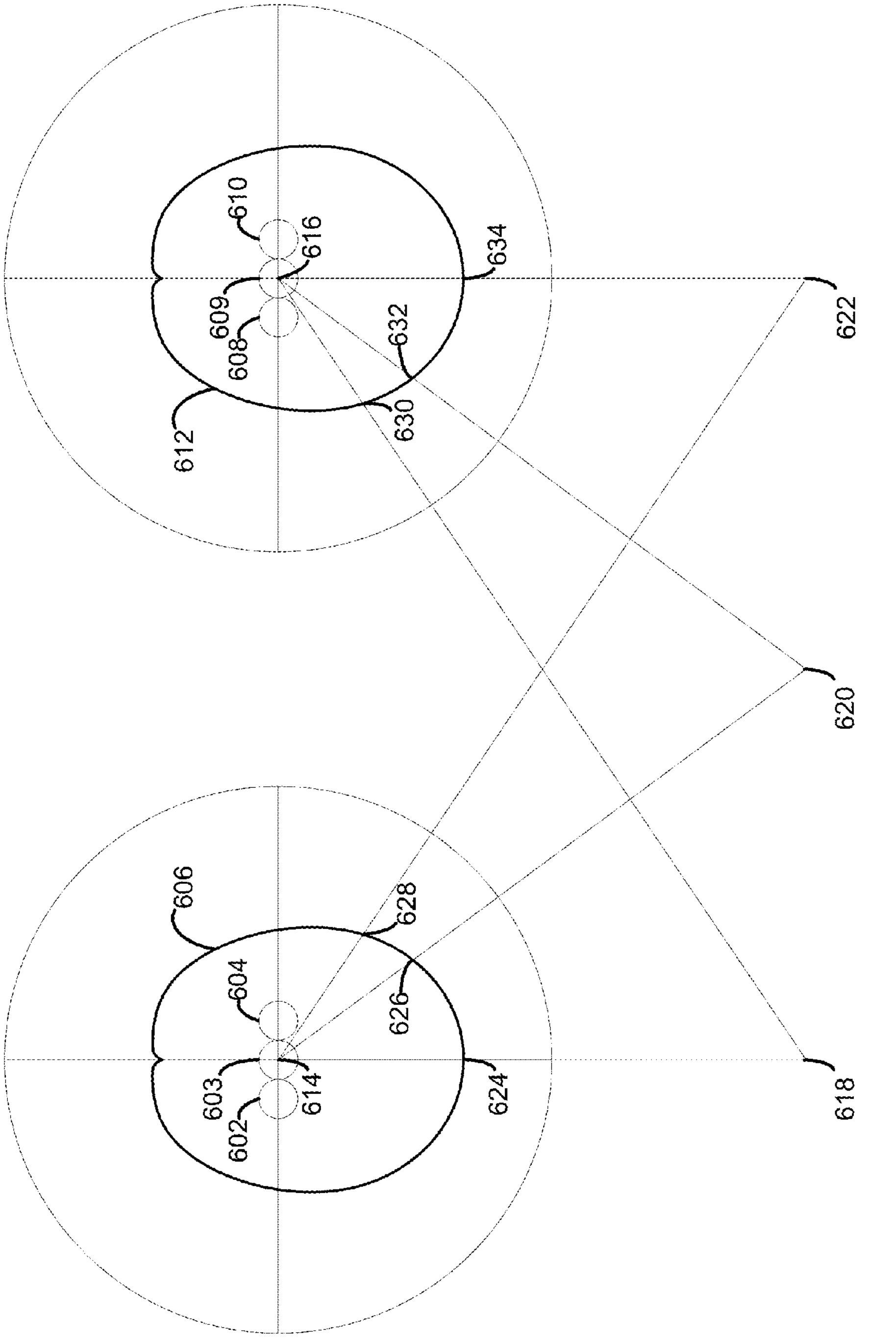
FIG. 6 shows graphical depictions of example radiation patterns for two sets of audio drivers.

Referring to FIG. 6 as an example, the method 500 may be performed by a media playback system that includes a first playback device and a second playback device. The first playback device may include audio drivers 602, 603, and 604 and the second playback device may include audio drivers 608, 609, and 610. In other examples, the audio drivers 602-610 may be different in number and/or each be included as part of a distinct playback device. But generally any of the audio drivers 602-610 may be incorporated, together or separately, into any number of playback devices.

While in FIG. 6 the audio drivers 602-610 are depicted as having collinear positions, in other examples, each of the audio drivers 602-610 may have any possible position and/or orientation with respect to other audio drivers of the audio drivers 602-610. For instance, the audio drivers 608-610 of the second playback device may be located behind, or set back from, the audio drivers 602-604 of the first playback device from the perspective of a given listening position (or vice versa). Also, any of the audio drivers 602-610 may be oriented and/or positioned differently or similarly. In one example, the audio driver 603 may be positioned behind, or set back from, the audio drivers 602 and 604. As another example, the audio driver 603 may be oriented upward toward a ceiling of a room while the audio drivers 602 and 604 may be oriented horizontally toward a wall of the room. Other examples are possible.

In FIG. 6, the audio drivers 602-604 are positioned collinear with the audio drivers 608-610 for ease of illustration, but one of skill in the art will recognize that the methods and systems disclosed herein may be used to beneficially use signal processing to compensate for any possible positioning and/or orientations of the audio drivers 602-610.

The audio drivers 602-610 may be configured to produce sound waves, collectively or individually, according to various radiation patterns. By way of example, a radiation pattern of a given audio driver (or a radiation pattern of a plurality of audio drivers) may be expressed mathematically as a function R(f, θ, φ). "R" may correspond to a (possibly complex) ratio of (i) an output sound wave amplitude generated by the given audio driver to (ii) an amplitude of an input signal provided to the given audio driver. Alternatively, "R" may correspond to a (possibly complex) ratio of (i) an output sound wave amplitude collectively generated by a plurality of audio drivers to (ii) a sum (or an average) of amplitudes of input signals respectively provided to the plurality of audio drivers. The output sound wave amplitude may be defined at a given distance from the given audio driver (or plurality of audio drivers). "f" may correspond to a frequency of the audio content, "θ" may correspond to an azimuthal angle with respect to the given audio driver (or a collective azimuthal angle with respect to a plurality of audio drivers), and φ may correspond to an inclination angle with respect to the given audio driver (or a collective inclination angle with respect to a plurality of audio drivers). For example, the azimuthal angle "θ" may be contained within a plane that is parallel to a horizontal axis of the media playback system, and the inclination angle φ may be contained within a plane that is defined by (i) a vertical axis of the media playback system and (ii) a direction indicated by the azimuthal angle. For ease of illustration, in this disclosure radiation patterns are depicted two-dimensionally in a plane defined by φ=0°, that is, an inclination angle of zero, but in other examples radiation patterns will generally be three-dimensional having variances dependent on the inclination angle φ as well as the azimuthal angle θ.

A radiation pattern corresponding to a given audio driver may be dependent on the given audio driver's construction, structure, geometry, materials, or orientation or position within a speaker box, for example. Such a radiation pattern that is dependent on "natural" features of the audio driver (and not audio processing techniques, for example) may be referred to as an "inherent" radiation pattern.

Also, for further reference, a "target" radiation pattern may be similar to any other radiation pattern mentioned herein, but "R" may correspond to a ratio of (i) an output sound wave amplitude generated by the given audio driver to (ii) an amplitude indicated by a received datum. That is, a target radiation pattern may reflect how frequency-dependent signal processing and a natural frequency response of the given audio driver act in concert to affect frequency-dependent output of the given audio driver.

Referring back to FIG. 6, the audio drivers 602, 603, and 604 may have respective inherent radiation patterns that, via superposition, form an inherent radiation pattern 606 (e.g., a first radiation pattern) that corresponds to the audio drivers 602, 603, and 604 collectively. (The inherent radiation patterns 606 and 612 may be depicted in FIG. 6 with respect to only a single audio content frequency or frequency range, for ease of illustration.) The inherent radiation pattern 606 may represent a radiation pattern produced by the audio drivers 602, 603, and 604 without any frequency-dependent signal processing (e.g., adjustment of amplitude and/or phase) being used for input signals of the audio drivers 602, 603, and 604.

Likewise, the audio drivers 608, 609, and 610 may have respective inherent radiation patterns that, via superposition, form an inherent radiation pattern 612 (e.g., a first radiation pattern) that corresponds to the audio drivers 608, 609, and 610 collectively. The inherent radiation pattern 612 may represent a radiation pattern produced by the audio drivers 608, 609, and 610 without any frequency-dependent signal processing being used for input signals of the audio drivers 608, 609, and 610. As noted above, the radiation patterns described herein may represent output sound wave amplitudes of audio content played back by given audio drivers at various locations about the given audio drivers.

The radiation pattern 606 may be depicted in FIG. 6 as a plot with respect to the azimuthal listening direction, with increasing distance from point 614 representing increasing magnitude of a ratio of (i) an output sound wave amplitude collectively produced by the audio drivers 602, 603, and 604 and (ii) the sum (or average) of input signal amplitudes respectively provided to the audio drivers 602, 603, and 604. For example, for a given audio frequency (or frequency range) and a given input signal amplitude provided to each of audio drivers 602, 603, and 604, the radiation pattern 606 may represent a larger output sound wave amplitude along listening direction 624 than along listening directions 626 or 628. The radiation pattern 612 may be depicted in FIG. 6 as a similar plot with respect to the audio drivers 608, 609, and 610, and point 616.

As an example, the inherent radiation pattern 606 may be defined along listening directions 624, 626, and 628 (as well as along other listening directions). As depicted, listening directions 624, 626, and 628 might vary in azimuth angle and not in the in inclination angle, but other examples are possible. One of skill in the art will recognize that inherent radiation patterns may also have variations with respect to inclination angle, and such variations with respect to the inclination angle may also be compensated for via signal processing to yield a target radiation pattern that is modified in some way with respect to inclination angle.

Along listening direction 624 (corresponding with listening position 618) the radiation pattern 606 may reach a maximum magnitude. (Listening position 618 may be an example of one of many possible positions of a human listener/user.) Along listening direction 626 (corresponding with listening position 620) the radiation pattern 606 may reach a reduced magnitude when compared to the listening direction 624. Along listening direction 628 (corresponding with listening position 622) the radiation pattern 606 may reach a further reduced magnitude when compared to the listening direction 624.

Likewise, the inherent radiation pattern 612 may be defined along listening directions 630, 632, and 634 (as well as along other listening directions). As depicted, listening directions 630, 632, and 634 might vary in azimuth angle and not in the in inclination angle, but other examples are possible. Along listening direction 634 (corresponding with listening position 622) the radiation pattern 612 may reach a maximum magnitude. Along listening direction 632 (corresponding with listening position 620) the radiation pattern 612 may reach a reduced magnitude when compared to the listening direction 634. Along listening direction 630 (corresponding with listening position 618) the radiation pattern 612 may reach a further reduced magnitude when compared to the listening direction 634.

Referring to FIG. 5, at block 502 the method 500 involves receiving data representing audio content, where each datum of the data indicates (i) a frequency and (ii) an amplitude corresponding to the frequency. For example, the playback device 112 of FIG. 1 may receive the data from a media service provider or network-attached storage, via the network interface 214 of the playback device 112.

Each datum of the received data may indicate a discrete frequency (e.g., 1 kHz) or a range of frequencies (e.g., 1-1.1 kHz). Each datum may also indicate an amplitude of the audio content at the corresponding frequency or range of frequencies. The amplitude may be that of a voltage, a current, or a power, for example. The indicated amplitude may also be defined with respect to a reference amplitude or defined as a dimensionless magnitude.

In some examples, the received data representing various frequencies (or ranges of frequencies) and respective amplitudes may be used to produce an input signal that is provided to input terminals of an audio driver. For instance, the received data may represent a first channel of a plurality of channels of the audio content. In short, the received data may include any information that may be used to generate one or more digital or analog signals representing the audio content. Providing a signal representing the received (e.g., unprocessed) data to each given audio driver may cause each given audio driver to provide sound according to its inherent radiation pattern.

Figure 7:
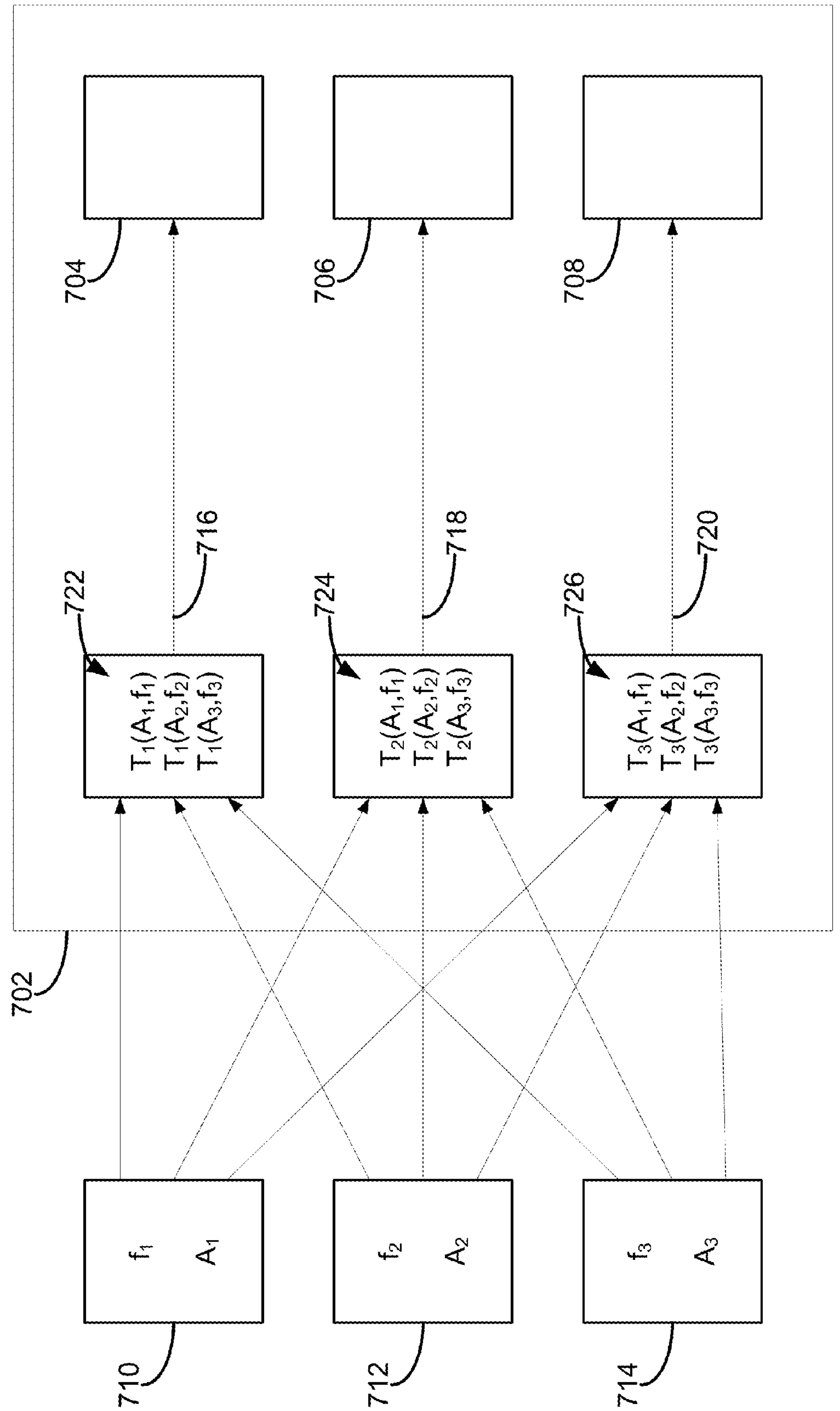
FIG. 7 shows a schematic block diagram of example operations of a media playback system.

Referring to FIG. 7 as an example, media playback system 702 may include audio drivers 704, 706, and 708. For example, the audio drivers may be similar to the audio drivers 602, 603, and 604 described above in relation to FIG. 6. The audio drivers 704-708 may be included as part of a single playback device, or may be respectively included as a part of any number of playback devices. The media playback system 702 (e.g., one or more playback devices) may receive datum 710, datum 712, and datum 714. As an example, datum 710 may indicate a frequency (or frequency range) $f_1$ and an amplitude $A_1$, datum 712 may indicate a frequency (or frequency range) $f_2$ and an amplitude $A_2$, and datum 714 may indicate a frequency (or frequency range) $f_3$ and an amplitude $A_3$.

In other examples, the received data may indirectly indicate frequencies and amplitudes via a time domain format. For example, the received data, as a whole, could represent a time-varying input signal to be provided to an audio driver. The time-varying signal may correspond to a time-varying air-pressure wave (sound wave) generated by the audio driver when the time-varying signal is provided to input terminals of the audio driver. In one example, the received data may be converted from time domain format to frequency domain format (or vice versa) via Fourier transform techniques, for example. In general, the received data may include any information that a processor and/or an audio driver may use to generate a sound wave representing the audio content.

Referring to FIG. 5, at block 504, the method 500 involves, for each audio driver of the plurality of audio drivers, determining a transfer function. Determining the transfer function for each of the plurality of audio drivers may include determining a transfer function based on one or more of (i) an inherent radiation pattern of one or more of the plurality of audio drivers, (ii) an orientation of one or more of the plurality of audio drivers with respect to the media playback system, (iii) a position of one or more of the plurality of audio drivers with respect to the media playback system, and/or (iv) one or more characteristics of an environment of the media playback system. For example, a given playback device may receive data identifying a type or a model of a playback device (e.g., the given playback device or a different playback device) with a known inherent radiation pattern, and determine the transfer function to yield a target radiation pattern based on the known inherent radiation pattern.

In some examples, transfer functions may be determined based on known orientations of the audio drivers 602-604 and 608-610 (which may define, at least in part, the inherent radiation patterns 606 and 612). For example, placement of a playback device may determine orientations of the audio drivers (e.g., placing the playback device on its base or on its side). Structural features of the playback device may further define orientations of the audio drivers as well. For example, audio drivers may be oriented in any given direction (e.g., parallel or perpendicular) with respect to an axis of the playback device. For instance, it may be useful to boost output of an audio driver that is not aligned with a probable location of a listener (for whatever reason) so that audio content projected by the given audio driver can be heard appropriately by a listener. Similarly, as described above, the transfer functions may be determined based on known positions of the audio drivers 602-604 and 608-610 (which may define, at least in part, the inherent radiation patterns 606 and 612).

The transfer functions may also be determined, at least in part, based on characteristics of the environment of a media playback system. For example, locations of objects within the environment and ambient humidity, barometric pressure, and/or temperature of the environment may affect the inherent radiation pattern of the audio drivers, thus changing the transfer function(s) that are suitable for producing the target radiation pattern(s). The media playback system may include or be in communication with suitable sensors (e.g., a humidity sensor, barometer, thermometer, etc.). (See FIG. 9 and related text below for more details regarding determining transfer functions based on the environment of the media playback system.)

Referring to FIG. 5, at block 506, the method 500 involves, for each audio driver of the plurality of audio drivers, processing each datum of the data based on (i) the frequency indicated by the given datum and (ii) the determined transfer function. For example, the media playback system 702 may process the data 710, 712, and 714 according to transfer functions $T_1$, $T_2$, and $T_3$.

For instance, the media playback system 702 may process data 710, 712, and 714 according to transfer function $T_1$ yielding processed data 722, and by further use of an analog-to-digital converter, yield an input signal 716 that is provided to input terminal(s) of the audio driver 704. The transfer function $T_1$ may be a frequency-dependent transfer function implemented by a processor and configured to cause the audio driver 704 to contribute to a target radiation pattern of audio drivers 704-708 that defines, at least in part, a widened area at which a listener may perceive a balanced directional effect to the played back audio content. That is, by use of the transfer function $T_1$, the media playback system 702 may boost, attenuate, and/or time-shift certain frequencies of the audio content provided to the audio driver 704 to widen the area at which the listener may perceive a balanced directional effect.

Similarly, the media playback system 702 may process data 710, 712, and 714 according to transfer function $T_2$ yielding processed data 724, and by further use of an analog-to-digital converter, yield an input signal 718 that is provided to input terminal(s) of the audio driver 706. The transfer function $T_2$ may be a frequency-dependent transfer function implemented by a processor and configured to cause the audio driver 706 to contribute to the target radiation pattern of audio drivers 704-708.

The media playback system 702 may also process data 710, 712, and 714 according to transfer function $T_3$ yielding processed data 726, and by further use of an analog-to-digital converter, yield an input signal 720 that is provided to input terminal(s) of the audio driver 708. The transfer function $T_3$ may be a frequency-dependent transfer function implemented by a processor and configured to cause the audio driver 708 to contribute to the target radiation pattern of audio drivers 704-708.

Figure 8:
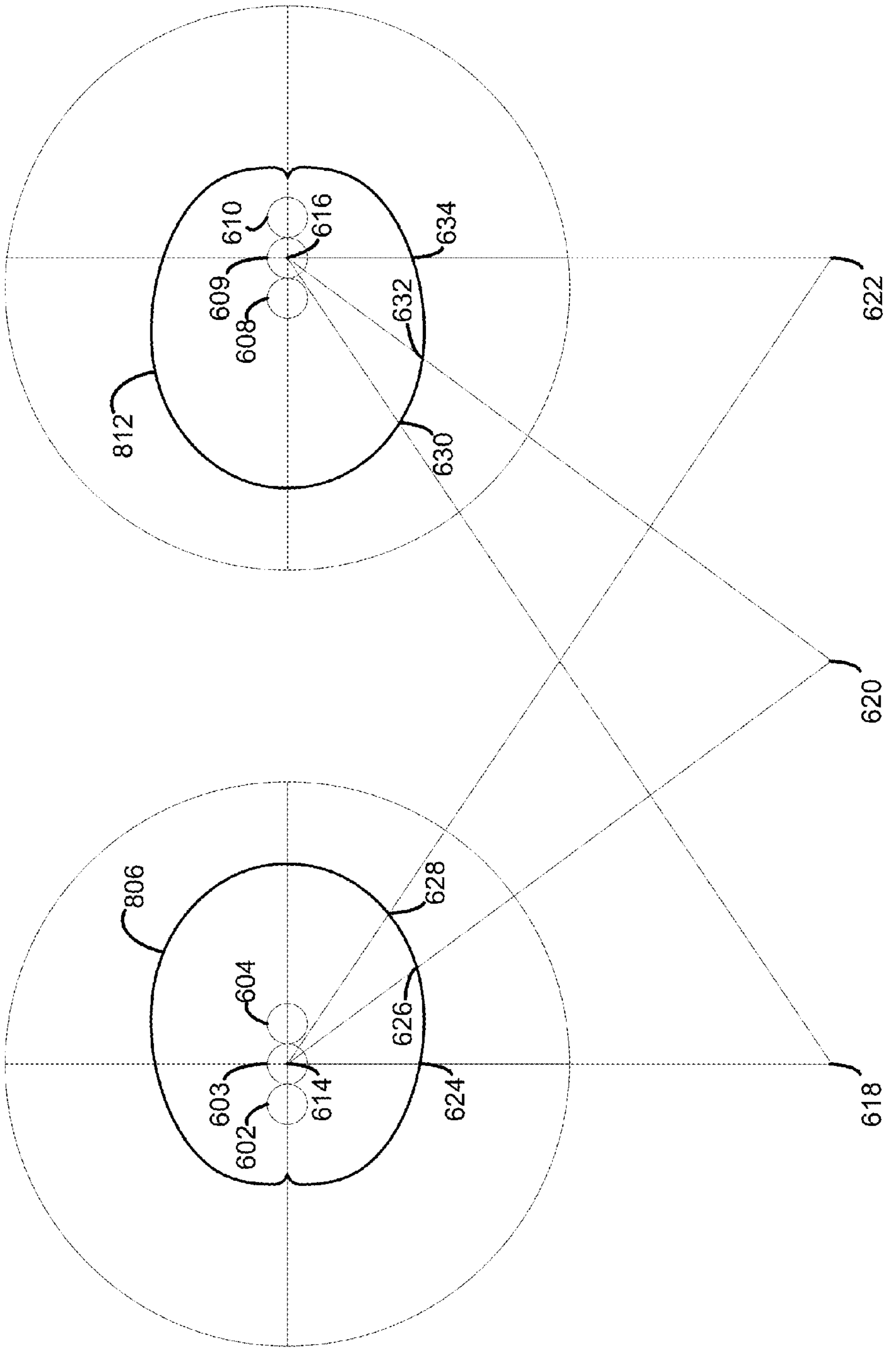
FIG. 8 shows graphical depictions of example radiation patterns for two sets of audio drivers.

Referring to FIG. 6 as an example, transfer functions for each of the audio drivers 602-610 may be determined based on the inherent radiation patterns 606 and 612 (or inherent radiation patterns corresponding individually to audio drivers 602-610) to produce a first target radiation pattern corresponding to the audio drivers 602-604 and a second target radiation pattern corresponding to audio drivers 608-610. Referring to FIG. 8, the target radiation patterns 806 and 812 (e.g., second radiation patterns) respectively corresponding to the audio drivers 602-604 and 608-610 may yield a widened area at which a listener may perceive a balanced directional effect to the played back audio content (i.e., when compared to the inherent radiation patterns 606 and 612). (The target radiation patterns 806 and 812 may be depicted in FIG. 8 with respect to only a single audio content frequency or frequency range, for ease of illustration.)

For example, at listening position 618, inherent radiation pattern 606 has a maximum value along listening direction 624 while inherent radiation pattern 612 does not have a maximum value along the listening direction 630. Further, because the listening position 618 is closer to the audio drivers 602-604 than the audio drivers 608-610, at listening position 618 the inherent radiation pattern 606 would represent a greater sound wave amplitude than the inherent radiation pattern 612 even if the maximum value of the inherent radiation pattern 612 was oriented toward the listening position 618. Therefore, at listening position 618, audio content played back by the audio drivers 602-604 may be too predominant in the listener's perception.

By further example, at listening position 622, inherent radiation pattern 612 has a maximum value along listening direction 634 while inherent radiation pattern 606 does not have a maximum value along the listening direction 628. Further, because the listening position 622 is closer to the audio drivers 608-610 than the audio drivers 602-604, at listening position 622 the inherent radiation pattern 612 would represent a greater sound wave amplitude than the inherent radiation pattern 606 even if the maximum value of the inherent radiation pattern 606 was oriented toward the listening position 622. Therefore, at listening position 622, audio content played back by the audio drivers 608-610 may be too predominant in the listener's perception.

Referring to FIG. 8 by way of comparison, at listening position 618, target radiation pattern 806 and target radiation pattern 812 have somewhat comparable magnitudes. This is because although the graphical representation of the target radiation pattern 812 at listening direction 630 is greater than the graphical representation of the target radiation pattern 806 at listening direction 624, the listening position 618 is closer to the audio drivers 602-604 than the audio drivers 608-610. Therefore, a balanced directional effect may be perceived at the listening location 618.

Likewise, at listening position 622, target radiation pattern 806 and target radiation pattern 812 have somewhat comparable magnitudes. This is because although the graphical representation of the target radiation pattern 806 at listening direction 628 is greater than the graphical representation of the target radiation pattern 812 at listening direction 634, the listening position 622 is closer to the audio drivers 608-610 than the audio drivers 602-604. Therefore, a balanced directional effect may be perceived at the listening location 622.

Once each transfer function has been determined, the transfer functions may be used to process each datum of the data. Referring to FIG. 7 for example, the media playback system 702 may use the transfer function $T_1$ to generate processed data 722 respectively corresponding to the received data 710-714. The processed data 722 may respectively represent the received data 710-714, but the processed data 722 may have new respective amplitudes that are boosted or attenuated in a frequency-dependent manner. The processed data 722 may also respectively represent the received data 710-714 but with frequency-dependent phase offsets (e.g. time delays/shifts) added. The transfer functions $T_2$ and $T_3$ may also be used to process the received data 710-714. For example, the media playback system 702 may use transfer function $T_2$ to generate processed data 724, and may use transfer function $T_3$ to generate processed data 726. In some examples, the transfer functions $T_1$, $T_2$, and $T_3$ may process the received data differently for at least one frequency represented by the received data 710-714.

Referring to FIG. 5, at block 508 the method 500 involves, for each audio driver of the plurality of audio drivers, providing, to the given audio driver, a respective signal representing the data processed for the given audio driver, thereby causing the plurality of audio drivers to play back the audio content according to a second radiation pattern that is different from the first radiation pattern. For example, the media playback system 702 may provide the input signal 716, representing the processed data 722, to input terminals of the audio driver 704. Also, the media playback system 702 may provide the input signal 718, representing the processed data 724, to input terminals of the audio driver 706. Further, the media playback system 702 may provide the input signal 720, representing the processed data 726, to input terminals of the audio driver 708.

In some cases, the method 500 may be useful in the context of playing back audio content that is multi-channel in format. For example, the media playback system may be a (first) playback device, and the received data may correspond to a first channel of the audio content. The first playback device may receive a command to play back the first channel of the audio content. For example, the playback device 112 of FIG. 1 may receive the command from the control device 126. The first playback device may then perform the functions of method 500 based on receiving the command. In such a situation, the respective signals representing the data processed for each audio driver may correspond to the first channel of the audio content. The first playback device may also cause the plurality of audio drivers (e.g., of the first playback device) to play back the first channel of the audio content in synchrony with a second playback device playing back a second channel of the audio content.

In some situations, it may be useful to have a media playback system switch from playing back the audio content in a multi-channel format to playing back the audio content in a monaural format. Accordingly, further operations related to the method 500 may involve receiving a command (e.g., from a control device) to play back a monaural channel of the audio content. For example, the media playback system may include one or more playback devices, and the one or more playback devices may all play back the monaural channel of audio content based on the media playback system receiving the command. Based on receiving the command, the media playback system may receive new data representing the monaural channel of the audio content, and based on the new received data, provide to the plurality of audio drivers additional respective signals that each represent the monaural channel of the audio content.

In a related example, the media playback system may be a first playback device that is included in a bonded zone with a second playback device. While the first playback device is included in the bonded zone, the first playback device may play back a first channel of a plurality of channels of the audio content. Accordingly, the data received by the first playback device may correspond to the first channel of the audio content. The first playback device may then receive a command to leave the bonded zone, and based on receiving the command, receive new data representing a monaural channel of the audio content. The first playback device may then, based on the new received data, provide to the plurality of audio drivers additional respective signals that each represent the monaural channel of the audio content.

Alternatively, upon leaving the bonded zone, the first playback device may receive new data representing multiple channels of the audio content. The first playback device may then provide to the plurality of audio drivers additional respective signals that each represent one of the multiple channels of the audio content. That is, the first playback device may transition from acting as a component of a multi-channel playback system to independently performing the multi-channel playback (e.g., via a plurality of audio drivers of the first playback device).

In some examples, the media playback system may collect data pertaining to the environment of the media playback system and process (e.g. on a real-time basis) data representing audio content based on the collected data. In this case, further operations related to the method 500 may involve the media playback system receiving second data from a sensor. The received second data may indicate one or more characteristics of the environment. The media playback system may process each datum (of the received first data) for each audio driver based on the received second data.

For example, the sensor may be one or more accelerometers and the received second data may indicate orientation(s) of the media playback system (e.g., orientation(s) of audio drivers and/or a playback device of the media playback system). The media playback system may then process the received first data (representing the audio content) based on the orientation of the media playback system (e.g., based on a radiation pattern of the media playback system that is dependent upon the orientation of the media playback system.)

Similarly, the media playback system may be a single playback device, and the sensor may be a proximity sensor. The received second data may indicate a location of the playback device relative to an additional playback device. The media playback system may then process the received first data (representing the audio content) based on the location of the media playback system. That is, changing a location of one or more playback devices (e.g., locations of audio drivers) may cause the media playback system to recalibrate its processing of the received first data to update radiation patterns of the media playback system so that the area at which the balanced directional effect may be perceived is widened.

Any of this aforementioned sensory data may be collected and used (perhaps in real-time) as the media playback system plays back the audio content. Accordingly, further operations related to the method 500 may involve the media playback system playing back the audio content prior to processing any of the received first data, continuing to play back the audio content while processing the received first data, and providing, to the plurality of audio drivers, respective signals representing the processed data, thereby modifying the play back of the audio content based on the one or more characteristics of the environment (e.g., on a real-time basis).

Figure 9:
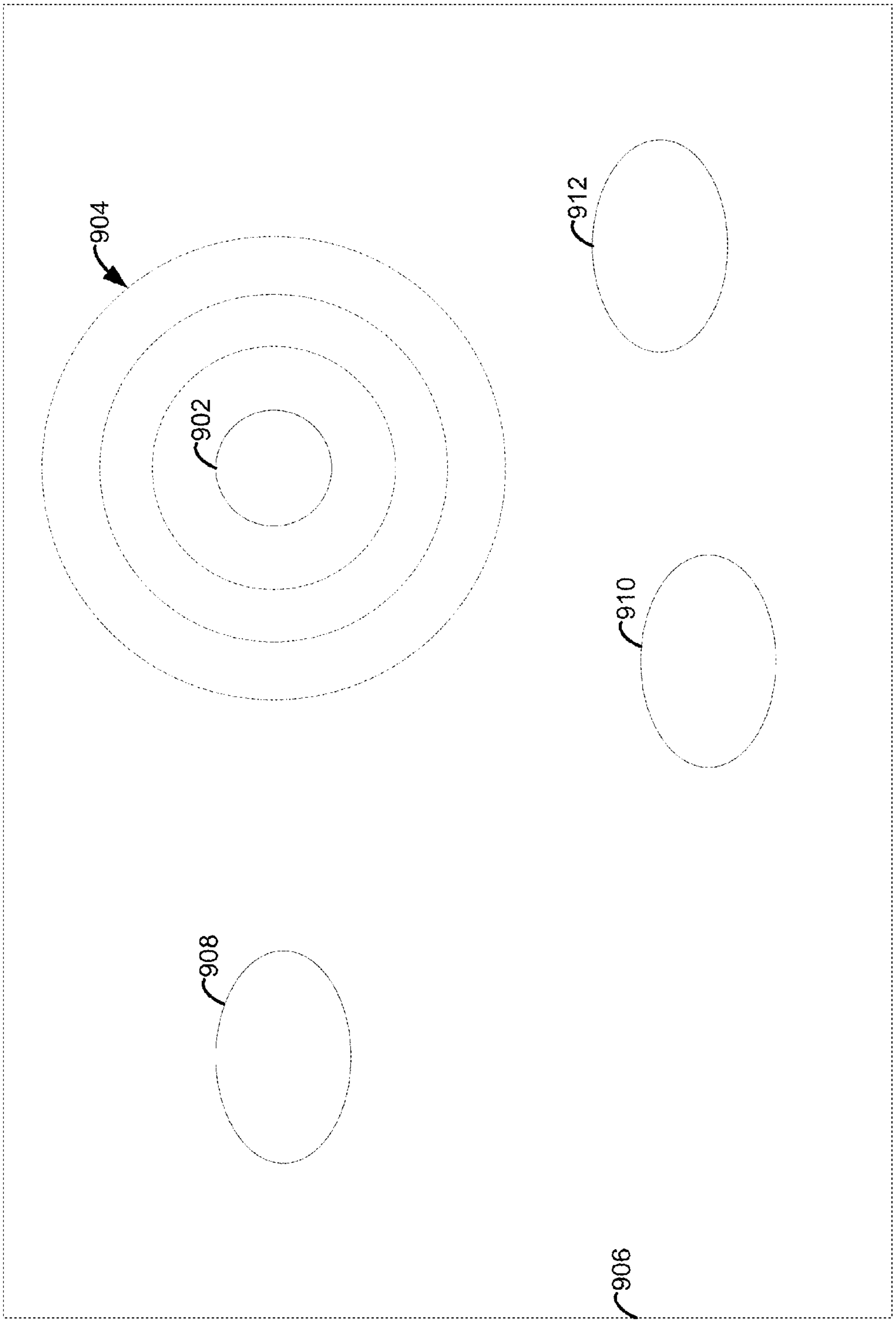
FIG. 9 shows example operations of a media playback system.

Further operations related to the method 500 may involve generating, via at least one of the plurality of audio drivers, an outgoing sound wave that propagates through an environment of the media playback system; detecting an incoming sound wave generated by the outgoing sound wave reflecting from one or more objects of the environment; and processing each datum for each audio driver based on the detected incoming sound wave. Referring to FIG. 9 for example, the media playback system 902 (e.g., a playback device) may generate an outgoing sound wave 904 that propagates through an environment (e.g., a room). The outgoing sound wave 904 may reflect from one or more of the objects 908, 910, 912 and/or a wall 906 that defines the room. The media playback system 902 may include an array of microphones (not shown) configured to detect directional variances of the reflected sound wave (not shown). Based on the directional variances of the reflected sound wave(s) and/or locations of other playback systems/devices within the environment, the playback system 902 may process the received data representing the audio content in a manner that creates a wide area at which the balanced directional effect may be perceivable to a listener.

In some examples, a first playback device (e.g., a group coordinator) may process data representing the audio content while a second playback device plays back the audio content, via the plurality of audio drivers, using the data processed by the first playback device. That is, the first playback device may process the received data representing the audio content and send the processed data (or an analog signal representing the processed data) to the second playback device so the second playback device (e.g., the plurality of audio drivers) may play back the audio content as processed by the first playback device.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Examples described herein involve, among other things. Other aspects of the examples will be made apparent in the remainder of the description herein.

In one aspect, an example media playback system includes a processor, a plurality of audio drivers having a first radiation pattern, and a non-transitory computer-readable medium storing instructions that when executed by the processor cause the media playback system to perform functions. The functions include receiving data representing audio content, where each datum of the data indicates (i) a frequency and (ii) an amplitude corresponding to the frequency. The functions further include, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

In another aspect, an example method is performed by a media playback system comprising a plurality of audio drivers having a first radiation pattern. The method includes receiving data representing audio content, where each datum of the data indicates (i) a frequency and (ii) an amplitude corresponding to the frequency. The method further includes, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

In yet another aspect, an example non-transitory computer-readable medium stores instructions that when executed by a media playback system cause the media playback system to perform functions. The media playback system includes a plurality of audio drivers having a first radiation pattern. The functions include receiving data representing audio content, where each datum of the data indicates (i) a frequency and (ii) an amplitude corresponding to the frequency. The functions further include, for each audio driver of the plurality of audio drivers, determining a transfer function; processing each datum of the data based on (i) the frequency indicated by the given datum and (ii) the determined transfer function; and providing, to the given audio driver, a respective signal representing the data processed for the given audio driver, thereby causing the plurality of audio drivers to play back the audio content according to a second radiation pattern that is different from the first radiation pattern.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A media playback system comprising:

a processor;

a network interface;

a first audio driver and at least a second audio driver, wherein the first and second audio drivers are configured to output audio content according to a first radiation pattern; and a non-transitory computer-readable medium storing instructions that, when executed by the processor, cause the media playback system to perform operations for providing audio content having an enhanced radiation pattern, the operations comprising:

receiving, via the network interface, first data and second data representing first and second channels, respectively, of multi-channel audio content, wherein the first and second data comprises audio data over a range of frequencies;

receiving, via the network interface, third data indicating one or more characteristics of a listening area in which the media playback system operates;

determining, based on the third data, a first transfer function corresponding to the first audio driver and a second transfer function corresponding to the second audio driver, wherein the first and second transfer functions are different;

generating a first audio output signal and a second audio output signal, wherein generating the first audio output signal comprises applying the first transfer function to the first and second data, and wherein generating the second audio output signal comprises applying the second transfer function to the first and second data; and providing the first audio output signal to the first audio driver and the second audio output signal to the second audio driver, thereby causing the first and second audio drivers to play back the multi-channel audio content according to the enhanced radiation pattern, wherein the enhanced radiation pattern has a wider balanced directional effect than the first radiation pattern.

2. The media playback system of claim 1, wherein determining the first transfer function further comprises determining the first transfer function based on one or more of (i) a radiation pattern of the first audio driver, (ii) an orientation of the first audio driver with respect to the listening area, and (iii) a position of the first audio driver with respect to the listening area.

3. The media playback system of claim 1, wherein the first transfer function is a frequency-dependent transfer function, and wherein generating the first audio output signal further comprises applying the first transfer function to the first and second data to determine a new amplitude corresponding to the first and second data.

4. The media playback system of claim 1, wherein the first transfer function is a frequency-dependent transfer function, and wherein generating the first audio output signal further comprises applying the first transfer function to the first and second data to determine a phase offset corresponding to the first and second data.

5. The media playback system of claim 1, wherein providing the first and second audio output signals to the first and second audio drivers, respectively, comprises, providing corresponding first and second analog signals to input terminals of the first and second audio drivers, respectively.

6. The media playback system of claim 1, further comprising:

a playback device housing the first and second audio drivers, wherein the operations further comprise:

receiving a command to play back the first channel of the multi-channel audio content; and based on receiving the command, playing back, via the playback device, the first channel of the multi-channel audio content.

7. The media playback system of claim 1, further comprising:

a first playback device housing the first audio driver; and a second device housing the second audio driver, wherein the operations further comprise:

causing the first audio driver to play back the first channel of the multi-channel audio content in synchrony with the second audio driver playing back the second channel of the multi-channel audio content.

8. The media playback system of claim 1, further comprising:

a first playback device; and a sensor in the first playback device, wherein the sensor is configured to output sensor data, and wherein the third data comprises the sensor data.

9. The media playback system of claim 8, further comprising a second playback device, wherein the sensor is a proximity sensor, and wherein the sensor data indicates a location of the first playback device relative to the second playback device.

10. The media playback system of claim 8, wherein the sensor is an accelerometer, and wherein the sensor data indicates an orientation of the first playback device.

11. The media playback system of claim 1, the operations further comprising:

generating, via at least one of the first audio driver and the second audio driver, an outgoing sound wave that propagates through the listening area; and detecting reflections generated by the outgoing sound wave reflecting from one or more objects of the listening area, wherein the third data includes data indicative of the detected reflections.

12. A method for providing audio content having an enhanced radiation pattern, the method performed by a media playback system comprising a network interface, a first audio driver, and at least a second audio driver, the first and second audio drivers configured to output audio content according to a first radiation pattern, the method comprising:

receiving, via the network interface, first data and second data representing first and second channels, respectively, of multi-channel audio content, wherein the first and second data comprises audio data over a range of frequencies; and receiving, via the network interface, third data indicating one or more characteristics of a listening area in which the media playback system operates;

determining, based on the third data, a first transfer function corresponding to the first audio driver and a second transfer function corresponding to the second audio driver, wherein the first and second transfer functions are different;

generating a first audio output signal and a second audio output signal, wherein generating the first audio output signal comprises applying the first transfer function to the first and second data, and wherein generating the second audio output signal comprises applying the second transfer function to the first and second data; and providing the first audio output signal to first audio driver and the second audio output signal to the second audio driver, thereby causing the first and second audio drivers to play back the multi-channel audio content according to the enhanced radiation pattern, wherein the enhanced radiation pattern has a wider balanced directional effect than the first radiation pattern.

13. The method of claim 12, wherein the first transfer function is a frequency-dependent transfer function, and wherein generating the first audio output signal further comprises applying the first transfer function to the first and second data to determine a new amplitude corresponding to the first and second data.

14. A non-transitory computer-readable medium storing instructions that, when executed by a media playback system comprising a network interface, a first audio driver, and at least a second audio driver, the first and second audio drivers configured to output audio content according to a first radiation pattern, cause the media playback system to perform functions for providing audio content having an enhanced radiation pattern, the functions comprising:

receiving, via the network interface, first data and second data representing first and second channels, respectively, of multi-channel audio content, wherein the first and second data comprises audio data over a range of frequencies;

receiving, via the network interface, third data indicating one or more characteristics of a listening area in which the media playback system operates;

determining, based on the third data, a first transfer function corresponding to the first audio driver and a second transfer function corresponding to the second audio driver, wherein the first and second transfer functions are different;

generating a first audio output signal and a second audio output signal, wherein generating the first audio output signal comprises applying the first transfer function to the first and second data, and wherein generating the second audio output signal comprises applying the second transfer function to the first and second data; and providing the first audio output signal to the first audio driver and the second audio output signal to the second audio driver, thereby causing the first and second audio drivers to play back the multi-channel audio content according to the enhanced radiation pattern, wherein the enhanced radiation pattern has a wider balanced directional effect than the first radiation pattern.

15. The non-transitory computer-readable medium of claim 14, wherein the second transfer function is a frequency-dependent transfer function, and wherein generating the first audio output signal further comprises applying the first transfer function to the first and second data to determine a new amplitude corresponding to the first and second data.

* * * * *